United States Patent [19]

Fushiya et al.

[11] Patent Number: 4,629,823
[45] Date of Patent: Dec. 16, 1986

[54] HOUSING FOR AN ELECTRIC APPARATUS WITH LEAD WIRES AND A DIE APPARATUS FOR MOLDING THE SAME

[75] Inventors: Mitsuji Fushiya, Toki; Shoichi Imanishi, Yokohama; Takeo Shiga, Kakamigahara, all of Japan

[73] Assignee: Tokyo Shibaura Denki Kabushiki Kaisha, Kawasaki, Japan

[21] Appl. No.: 495,131

[22] Filed: May 16, 1983

[30] Foreign Application Priority Data

May 29, 1982 [JP] Japan ............................ 57-91982

[51] Int. Cl.⁴ .............................................. H05K 7/02
[52] U.S. Cl. .................................... 174/52 R; 312/223
[58] Field of Search ............... 174/50, 52 R, 72 A, 174/70 C, 48; 68/3 R, 212; 361/428; 312/223, 257 A

[56] References Cited

U.S. PATENT DOCUMENTS

| | | | |
|---|---|---|---|
| 3,253,874 | 5/1966 | Czech | 312/223 X |
| 3,590,136 | 6/1971 | Kunishi et al. | 174/50 |
| 3,944,719 | 3/1976 | Rubey | 174/72 A |
| 4,003,613 | 1/1977 | Oakley | 312/223 X |
| 4,227,239 | 10/1980 | Boyer et al. | 174/72 A |

FOREIGN PATENT DOCUMENTS

| | | |
|---|---|---|
| 261731 | 6/1964 | Australia . |
| 294591 | 12/1967 | Australia . |
| 459013 | 4/1972 | Australia . |
| 465996 | 12/1973 | Australia . |
| 52-24389 | 6/1977 | Japan . |

Primary Examiner—Arthur T. Grimley
Assistant Examiner—D. A. Tone
Attorney, Agent, or Firm—Cushman, Darby & Cushman

[57] ABSTRACT

An electric washing machine is provided with a housing with a plurality of lead wires connected to electrical equipment. A panel of the housing is formed of synthetic resin and a plurality of retaining portions are integrally formed with the panel and formed of synthetic resin. The retaining portions are arranged at intervals at the panel so as to hold the lead wires therein.

5 Claims, 9 Drawing Figures

HOUSING FOR AN ELECTRIC APPARATUS WITH LEAD WIRES AND A DIE APPARATUS FOR MOLDING THE SAME

BACKGROUND OF THE INVENTION

The present invention relates to a housing for an electric apparatus with lead wires and a die apparatus for molding the housing.

In an electric apparatus, such as an electric washing machine, electrical equipment including a changeover switch, timers, etc. is attached to the panel of a control box. The electrical equipment is electrically inter-connected by means of a number of lead wires. These lead wires are previously bundled by means of a tape so as not to come apart or become tangled. The respective terminals of the lead wires bundled in this manner are coupled to the terminals of their corresponding electrical equipment before the equipment is mounted on the control panel. After the connected electrical equipment is attached to the control panel, the bundle of lead wires is attached to hooks protruding from the back of the control panel.

However, in the prior art housing for the electric washing machine of such a construction, because the electrical equipment is inter-connected by lead wires, as mentioned before, it is very difficult to automatically attach the electrical equipment to the control panel using an automatic assembling machine, so that the assembly work cannot be automated. Moreover, it is quite troublesome to tape the bundle of lead wires or to manually engage the taped bundle of lead wires with the hooks. Thus, the apparatus of this type exhibits a very low assembling efficiency.

SUMMARY OF THE INVENTION

The present invention was created in consideration of these circumstances, and a first object of the invention is to provide a housing for an electric apparatus with lead wires enabling automatic assembly of electrical equipment thereon by means of an assembling machine and obviating the necessity of lead wire taping and fixing operations, thereby rationalizing the assembly work. A second object of the invention is to provide a die apparatus very simple in construction and capable of molding the housing to attain the first object.

According to one aspect of the present invention, there is provided a housing for an electric apparatus with at least one lead wire connected to electrical equipment, which comprises a main body including a portion formed of synthetic resin, and a plurality of retaining portions integrally formed with the portion and formed of synthetic resin and arranged at intervals at the portion so as to hold the lead wire therein. According to another aspect of the invention, there is provided a die apparatus which comprises first and second dies facing each other and including first and second surfaces, respectively, which face each other with a space therebetween when the first and second dies are joined together, the space between the first and second surfaces defining a main cavity for forming the main body of the housing, third and fourth surfaces defining a space to house the lead wire, the third and fourth surfaces being isolated from the first and second surfaces, respectively, and a plurality of sets of fifth and sixth surfaces arranged at intervals on the third and fourth surfaces so as to be able to face one another, each set of fifth and sixth surfaces defining an auxiliary cavity for forming a retaining portion to surround those portions of the lead wire which face the fifth and sixth surfaces, the auxiliary cavity being connected with the main cavity, the third surface having depressions to house the end portions of the lead wire, and the depressions being isolated from the main and auxiliary cavities.

DETAILED DESCRIPTION OF THE PREFERRED EMBODIMENTS

Referring now to the accompanying drawings of FIGS. 1 to 6, a housing according to one embodiment of the present invention will be described in detail as applied to an electric washing machine.

Figure 1:
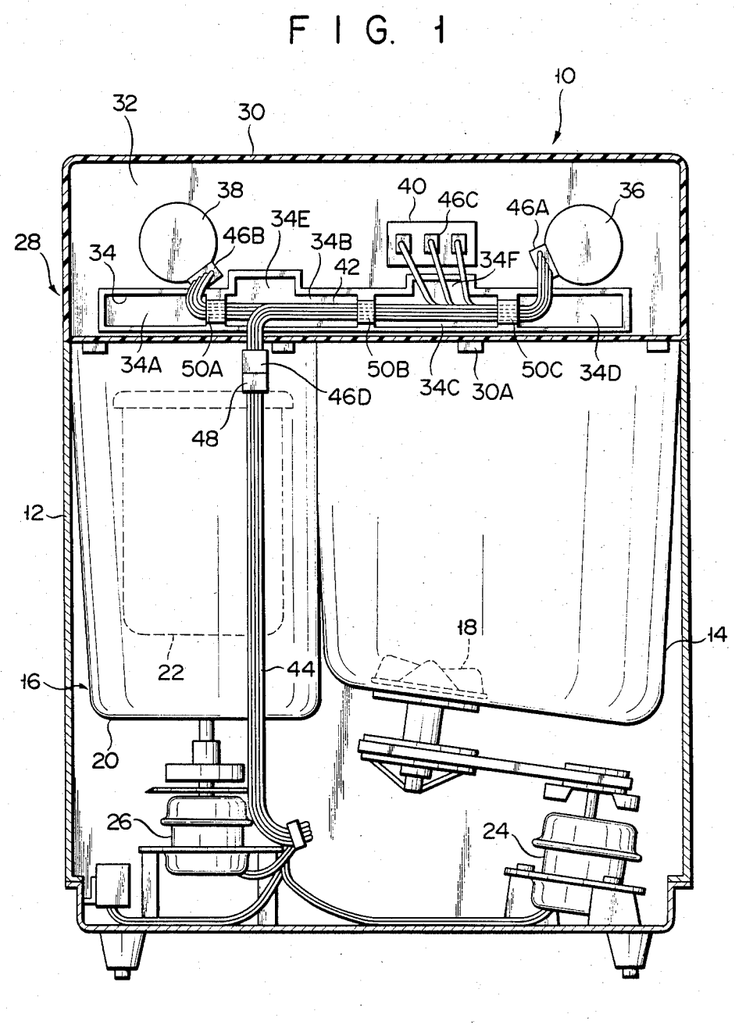
FIG. 1 is a vertical rear sectional view showing a housing according to one embodiment of the present invention applied to an electric washing machine.

In FIG. 1, numeral 10 designates an electric washing machine of a double-tank type as an electric apparatus. The electric washing machine 10 has a case 12 in which a washing tank 14 and a drying tank 16 are arranged. A pulsator 18 is rotatably mounted on an eccentric portion of the bottom face of the washing tank 14. The drying tank 16 includes a fixed water reservoir 20 and a rotary tub 22 rotatably housed in the water reservoir 20. Fixed to the bottom portion of the case 12 are a first motor 24 for rotating the pulsator 18 and a second motor 26 for rotating the rotary tub 22. The washing tank 14 and the water reservoir 20 are connected individually with drain pipes (not shown) each having a valve. Water in the washing tank 14 or the water reservoir 20 is discharged to the outside when its corresponding valve is opened.

A control box 28 as the housing according to one embodiment of the invention is attached to the rear portion of the top face of the case 12 by means of screws (not shown). The control box 28 is set on the casing 12 after it is mounted with various electrical equipment. The control box 28 has a base member (not shown) and a front panel 32 connected to the base and provided with a frame 30 surrounding the front panel 32. The front panel 32 is formed of synthetic resin. An opening 34 (described in detail later) is formed in the lower portion of the front panel 32, extending horizontally.

Figure 2:
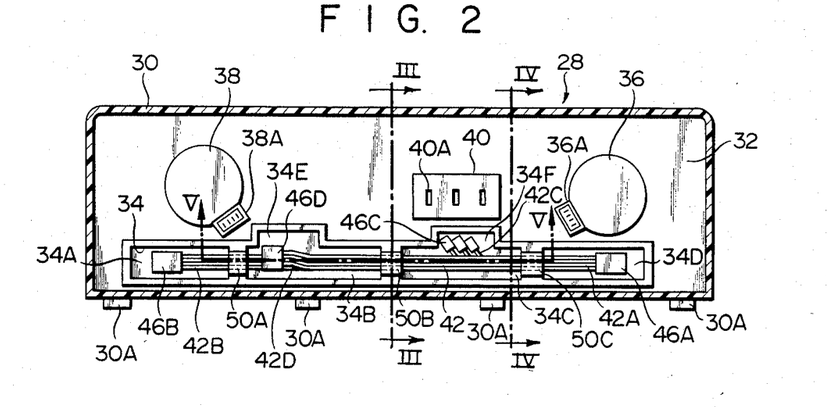
FIG. 2 is an isolated rear view of the housing shown in FIG. 1.

The front panel 32 is mounted with first and second timers 36 and 38 and a changeover switch 40 as electrical equipment. The first timer 36 serves to set the drive time of the first motor 24, that is, to control the washing and rinsing operations. The second timer 38 serves to set the drive time of the second motor 26, that is, to control the drying operation. The changeover switch 40 is provided for controlling the speed of the first motor 24, that is, to control the strength of the water streams in the washing tank 14. As shown in FIG. 2, the first and second timers 36 and 38 and the changeover switch 40 are provided with female terminal groups 36A, 38A and 40A, respectively, for signal input and output.

The front panel 32 is integrally connected with a plurality of lead wires 42. The lead wires 42 are provided for electrically connecting the first timer 36 with the changeover switch 40 in the control box 28, and for connecting the first and second timers 36 and 38 with the first and second motors 24 and 26, respectively. The lead wires 42 have four terminal groups 42A, 42B, 42C and 42D, and the individual terminals of the terminal groups 42A to 42D are fitted with male terminals (not shown). The male terminals of the first terminal group 42A are connected individually to the female terminal group 36A of the first timer 36, while those of the second terminal group 42B are connected individually to the female terminal group 38A of the second timer 38. The male terminals of the third terminal group 42C are connected individually to the female terminal group 40A of the changeover switch 40. The male terminals of the fourth terminal group 42D are connected to a female terminal group (not shown) at one end of another lead wire group 44 mentioned later. The other end of the second lead wire group 44 diverges into a plurality of groups, as shown in FIG. 1. One of these groups is connected to the first motor 24, while another is connected to the second motor 26.

The first to fourth terminal groups 42A, 42B, 42C and 42D are respectively provided with connector housings 46A, 46B, 46C and 46D open at the front end so as to surround their corresponding male terminals. A connector housing 48 is fitted on one end of the second lead wire group 44 so as to surround the female terminals thereat.

The lead wires 42 extend inside the opening 34 substantially along the extending direction thereof. The lead wires 42 are retained integrally on the front panel 32 by means of retaining portions 50A, 50B, and 50C which are formed integrally with the front panel 32 by molding in positions to divide the opening 34 into four substantially equal parts along the extending direction thereof. In other words, the lead wires 42 are fixed to the front panel 32 at three equally-spaced positions. The opening 34 is divided into four opening portions 34A, 34B, 34C and 34D by the retaining portions 50A, 50B and 50C. A decoration panel is provided to hide the opening portions 34A–34D from the front and its back surface can be seen in the opening portions 34A–34D, shown in FIGS. 1 and 2.

The first opening portion 34A is wide enough to shelter the second connector housing 46B at the molding. The second opening portion 34B is continuous with a fifth opening portion 34E to shelter the fourth connector housing 46D at the molding. The third opening portion 34C is continuous with a sixth opening portion 34F to shelter the third connector housing 46C at the molding. The fourth opening portion 34D is wide enough to shelter the fourth connector housing 46D at the molding.

A plurality of engaging clicks 30A to engage the base (not shown) protrude downward from the bottom face of the frame 30 of the control box 28. Engaging slots (not shown) to receive the individual engaging clicks 30A are formed at the front portion of the base. The front panel 32 is mounted on the base through the engagement of the engaging slots and the engaging clicks 30A.

Referring now to FIGS. 3 to 6, there will be described a molding die apparatus 52 for molding the control box 28 of the aforementioned construction.

The molding die apparatus 52 comprises first and second dies 54 and 56. Before being mounted with the electrical equipment, the control box 28, with the lead wires 42 integrally provided, is molded by the first and second dies 54 and 56.

Figure 3:
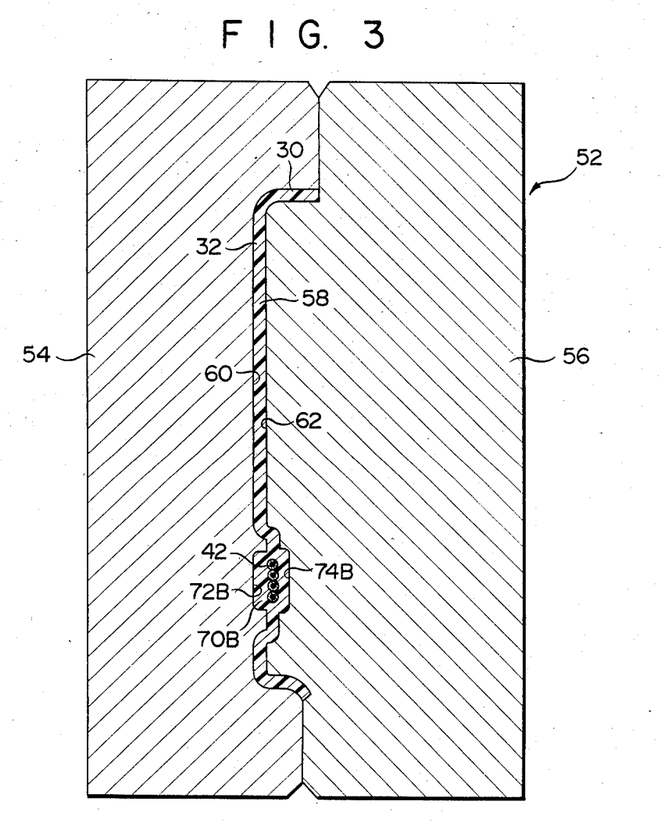
FIG. 3 is a vertical sectional view corresponding to a sectional view of the housing taken along line III—III of FIG. 2 and illustrating a process of molding the housing.
Figure 4:
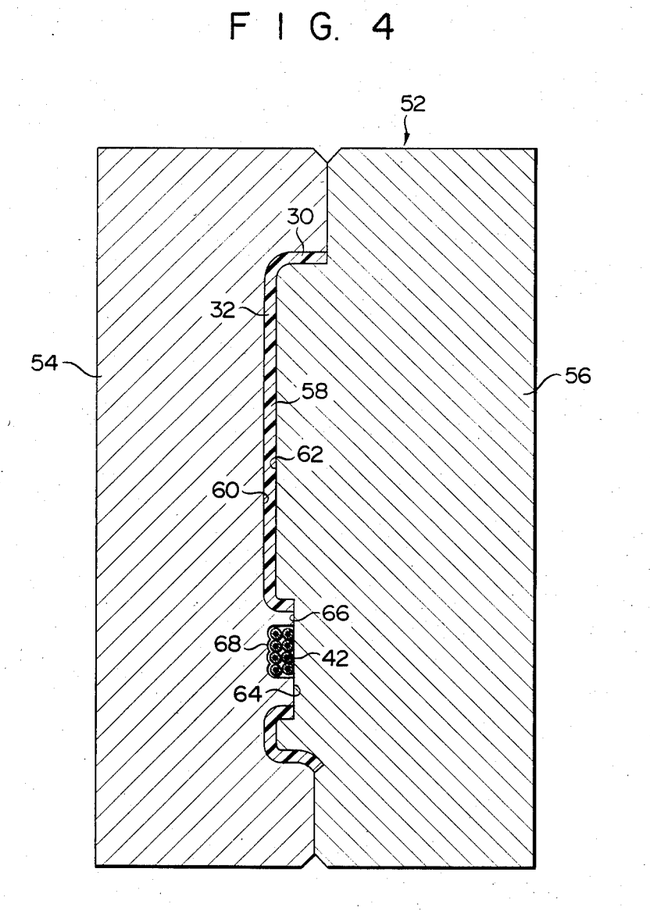
FIG. 4 is a vertical sectional view corresponding to a sectional view taken along line IV—IV of FIG. 2 and illustrating the process of molding the housing.
Figure 6:
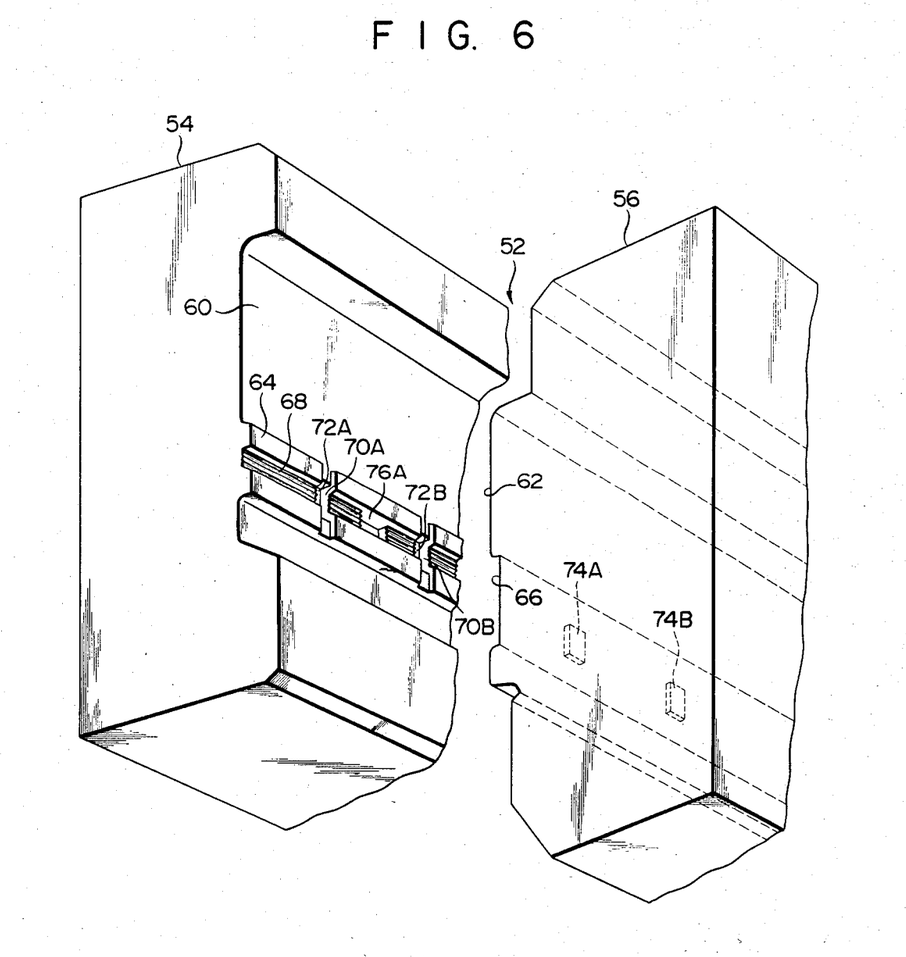
FIG. 6 is a partial perspective view of a die apparatus.

The first and second dies 54 and 56 have first and second surfaces 60 and 62, respectively, which, when joined together, define a main cavity 58 for forming the frame 30 and the front panel 32 of the control box 28. As shown in FIGS. 4 and 6, the first and second dies 54 and 56 have first and second contact faces 64 and 66, respectively, for dividing the main cavity 58 at its lower portion to define the opening 34. The first die 54 has a hollow 68 which opens in the contact face 64 to house the lead wires 42. As shown in FIGS. 3 and 6, the first and second dies 54 and 56 are provided, respectively, with third surfaces 72A, 72B and 72C and fourth surfaces 74A, 74B and 74C to define auxiliary cavities 70A, 70B and 70C for forming the retaining portions 50A, 50B and 50C. The auxiliary cavities 70A, 70B and 70C are connected to the main cavity 58. Therefore, the wires 42, which are set so as to pass through the auxiliary cavities 70 at the time of molding, are molded integrally with the front panel 32 at the retaining portions 50A, 50B and 50C.

Figure 5:
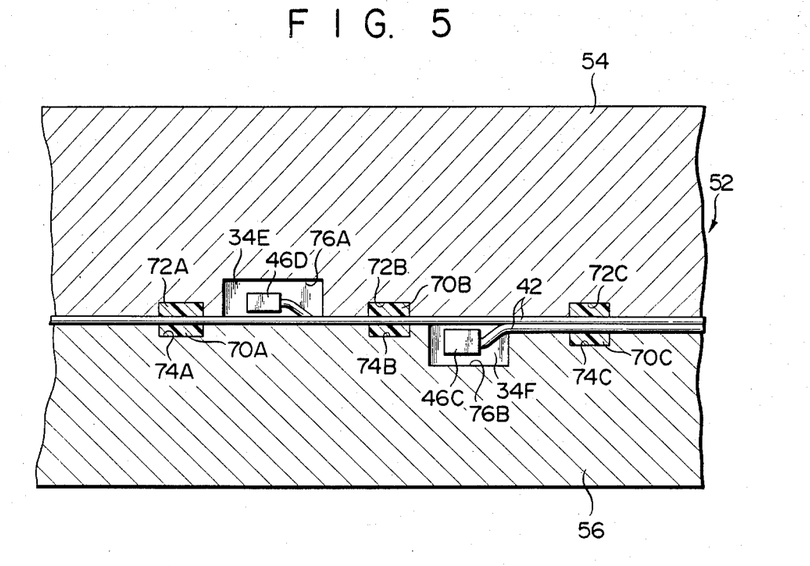
FIG. 5 is a cross-sectional view corresponding to a sectional view taken along line V—V of FIG. 2 and illustrating the process of molding the housing.

As shown in FIG. 5, the first die 54 has a first depression 76A for defining the fifth opening portion 34E. The first depression 76A is formed in that portion of the contact face 64 which lies between the first and second auxiliary cavities 70A and 70B. The second die 56 has a second depression 76B for defining the sixth opening portion 34F. The second depression 76B is formed in that portion of the contact face 66 which lies between the second and third auxiliary cavities 70B and 70C. The first and second depressions 76A and 76B are both isolated from the main cavity 58, so that molding resin is prevented from flowing into the depressions 76A and 76B to seal the same. At the time of molding, the first depression 76A shelters the fourth terminal group 42D of the lead wires 42 and the fourth connector housing 46D enclosing the same, thereby preventing them from being sealed by the resin. Moreover, the second depression 76B shelters the third terminal group 42C of the lead wires 42 and the third connector housing 46C enclosing the same, thereby preventing them from being sealed by the resin.

The manner of assembling the electric washing machine 10 of the aforementioned construction will now be described.

First, the front panel 32 of the control box 28, previously fitted with the lead wires 42 in an integral manner, is formed by the molding die apparatus 52, and the first and second timers 36 and 38 and the changeover switch 40 as the electrical equipment are individually attached to the front panel 32. As they are connected with no lead wires, this electrical equipment can be handled as individual units, and can therefore be assembled automatically by means of an automatic assembling apparatus.

Thereafter, the male terminals of the first, second and third terminal groups 42A, 42B and 42C of the lead wires 42 are connected to the female terminal groups 36A, 38A and 40A of the first and second timers 36 and 38 and the changeover switch 40, respectively. In this operation, the lead wires 42 are integrally fixed at intervals to the front panel 32 by means of the retaining portions 50A, 50B and 50C, so that they will never come apart or move in the control box 28 to lower the operating efficiency of the washing machine. Thus, it is quite unnecessary to bundle the lead wires 42 by means of a tape after they are connected to the terminals or to fix the bundled lead wires 42 to the control box 28. According to this one embodiment, therefore, the electrical equipment can be mounted automatically, and the wires 42 can be fixed to the control box 28 in advance. This leads to a substantial improvement of assembling efficiency.

The front panel 32 thus mounted with the electrical equipment is attached to the base through the engagement between the engaging clicks 30A and the engaging slots, thus forming the control box 28. Then the control box 28 is fixed to the case 12 by screws. Thereafter, the male terminals of the fourth terminal group 42D of the lead wires 42 are connected to the female terminals at the one end of the second lead wire group 44. This connection causes the electrical equipment and the motors 24 and 26 to be connected, and the drive of the motors 24 and 26 is controlled by the equipment.

The molding resin for the front panel 32 is poured into the main cavity 58 and the auxiliary cavities 70A, 70B and 70C while it is melted at a relatively high temperature (approx. 200° C.). Accordingly, the resin may seemingly melt the covering of the lead wires 42 made of, e.g., polyvinyl chloride. According to the present embodiment, however, the retaining portions 50A, 50B and 50C can be made relatively narrow, since they are so designed that the lead wires 42 are sealed at intervals. Therefore, even if the molding resin is hot, the amount of molding resin touching the lead wires 42 is small, so that very little heat is transferred to them. Thus, the covering of the lead wires 42 will never be melted by the molding resin.

According to the molding die apparatus 52 of this embodiment, the lead wires 42 are retained on the contact faces 64 and 66 of the first and second dies 54 and 56. Accordingly, the lead wires 42 can be held in the substantially central portions of the auxiliary cavities 72A, 72B and 72C, while the dies 54 and 56 are made as simple in construction as possible. This can be done because the lead wires 42 are retained at a plurality of portions of the contact faces 64 and 66 of the dies 54 and 56 at relatively narrow intervals so as to be prevented from slackening between the retaining portions 50A and 50B and between the retaining portions 50B and 50C. Thus, the lead wires 42 can be set taut, so that they can be securely retained in the substantially central portions of the auxiliary cavities 70A, 70B and 70C.

It is to be understood that the present invention is not limited to the construction of the embodiment described above, and that various changes and modifications may be effected therein by one skilled in the art without departing from the scope or spirit of the invention.

Figure 7:
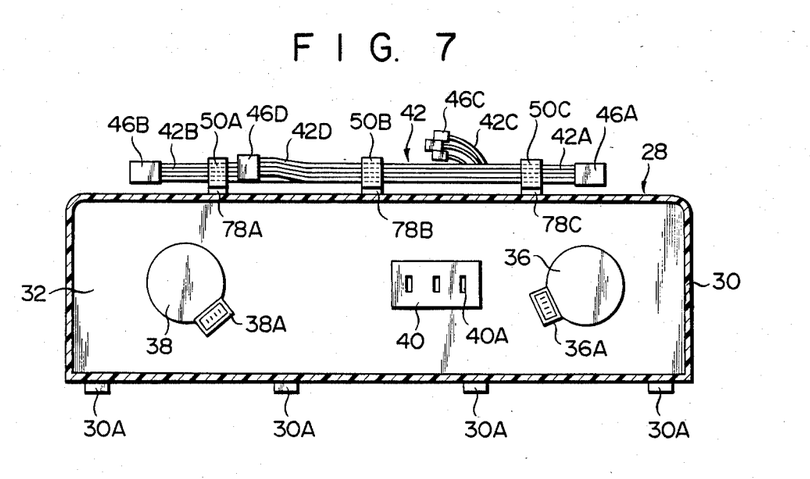
FIG. 7 is an extractive rear view of a housing according to another embodiment of the invention.
Figure 8:
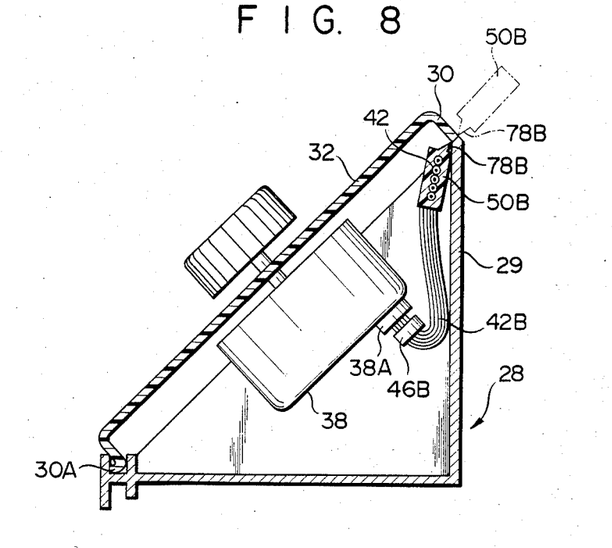
FIG. 8 is a vertical sectional view of a control box assembled using the housing shown in FIG. 7.

Referring now to FIGS. 7 and 8, a second embodiment of the present invention will be described. In the description to follow, like reference numerals are used to designate like portions included in the foregoing embodiment. In this second embodiment, the opening 34 is not formed in the front panel 32, and the retaining portions 50A, 50B and 50C are integrally attached to the rear end edge of the top face of the frame 30 by means of bendable thin portions 78A, 78B and 78C, respectively. As shown in FIG. 7, the retaining portions 50A, 50B and 50C protrude upward from the frame 30 immediately after they are molded. Like those of the first embodiment, the retaining portions 50A, 50B and 50C are attached to the top face of the frame 30 at intervals.

In assembling the control box 28 of such construction, the electrical equipment including the first timer 36, second timer 38 and changeover switch 40 is mounted on the front plane 32, and then the outwardly projecting retaining portions 50A, 50B and 50C are bent or turned inward around the thin portions 78A, 78B and 78C, respectively, and then the front panel 32 is attached to a base 29, as shown in FIG. 8. Thereafter, the male terminals of the terminal groups 42A, 42B and 42C of the lead wires 42 are connected to the female terminal groups 36A, 38A and 40A.

The same effect of the first embodiment may be obtained with use of the second embodiment constructed in this manner.

Figure 9:
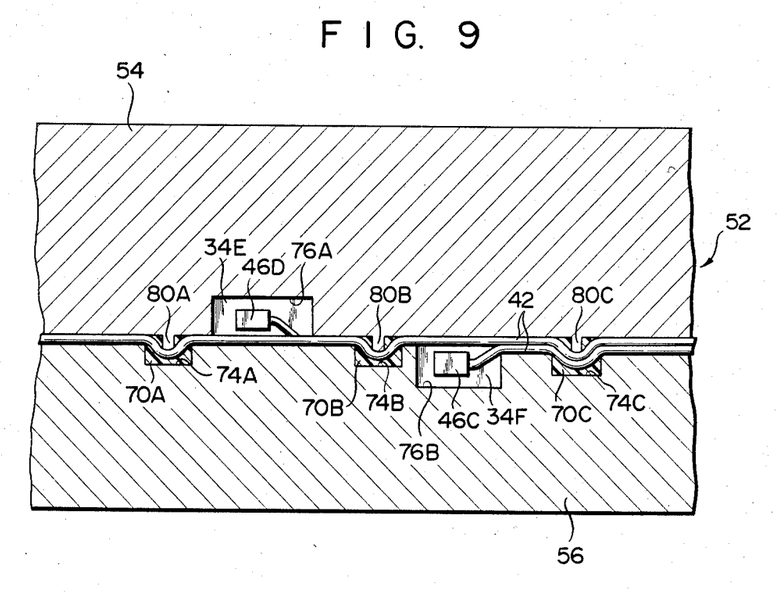
FIG. 9 is a sectional view showing a modification of the die apparatus.

FIG. 9 shows a modification of the molding die apparatus 52. In the molding die apparatus of the first embodiment, the auxiliary cavities 70A, 70B and 70C defining the retaining portions 50A, 50B and 50C, respectively, are defined by the depressions 72A, 72B and 72C in the first die 54 and the depressions 74A, 74B and 74C in the second die 56, respectively. As shown in FIG. 9, however, the depressions 74A, 74B and 74C to define the auxiliary cavities 70A, 70B and 70C may be formed only in the second die 56. In this case, projections 80A, 80B and 80C are formed at those portions of the first die 54 which face the depressions 74A, 74B and 74C, respectively, so that the lead wires 42 pass through the central portions of the depressions 74A, 74B and 74C. The lead wires 42 are pushed out into the respective central portions of the depressions 74A, 74B and 74C by the projections 80A, 80B and 80C.

The same effect of the first embodiment may be obtained with use of the molding die apparatus 52 constructed in this manner.

According to the present invention, as described in detail herein, there may be provided a housing for an electric apparatus which enables automatic assembly of electrical equipment thereon by means of an assembling machine and obviates the necessity of lead wire taping and fixing operations, thereby rationalizing the assembly work, and also a die apparatus which is simple in construction and capable of molding the housing.

What we claim is:

1. A housing for mounting therein an electric apparatus, said housing comprising:
   a main body including a portion made of synthetic resin, said main body portion being located inside said main body;
   electrical connection means contained within said housing for interconnecting the electric apparatus, said electrical connection means including:
   (a) a plurality of retaining portion made of sythetic resin and integrally formed to extend into the housing from said main body portion, said plurality of retaining portions being arranged at intervals of said main body portion and being fixed to the main body portion in a flexible manner; and (b) a plurality of electrical wires held within said plurality of retaining portions.

2. The housing according to claim 1, wherein said main body portion is located at the peripheral edge portion of the main body.

3. The housing according to claim 2, wherein each one of said plurality of retaining portions is attached to the main body portion by means of a thin portion.

4. A housing for mounting therein an electric apparatus, said housing comprising:

a first portion made of synthetic resin;

a second portion made of synthetic resin and including electrical connection means contained within said housing for interconnecting the electric apparatus, said second portion being fixed to said first portion in a flexible manner, said electrical connection means including:

(a) a plurality of retaining portions made of synthetic resin and integrally formed to extend into the housing; and (b) a plurality of electrical wires held within said plurality of retaining portions.

5. The housing according to claim 4, wherein said second portion is attached to the first portion by means of a thin portion.

* * * * *